United States Patent [19]

Watanabe

[11] Patent Number: 4,900,953
[45] Date of Patent: Feb. 13, 1990

[54] LOGIC CIRCUIT EMPLOYING FIELD EFFECT TRANSISTOR HAVING JUNCTION WITH RECTIFYING CHARACTERISTIC BETWEEN GATE AND SOURCE

[75] Inventor: Yuu Watanabe, Hadano, Japan
[73] Assignee: Fujitsu Limited, Kawasaki, Japan
[21] Appl. No.: 163,508
[22] Filed: Mar. 2, 1988
[30] Foreign Application Priority Data Mar. 11, 1987 [JP] Japan ................................. 62-53952

[51] Int. Cl.$^4$ .................... H03K 19/094; H03K 19/21
[52] U.S. Cl. .................................... 307/450; 307/464; 307/471
[58] Field of Search ................. 307/448, 450, 464, 471

[56] References Cited

U.S. PATENT DOCUMENTS

| | | | |
|---|---|---|---|
| 4,048,518 | 9/1977 | Koo | 307/448 |
| 4,518,871 | 5/1985 | Toyoda et al. | 307/448 |
| 4,743,782 | 5/1988 | Nelson et al. | 307/450 |
| 4,755,695 | 7/1988 | Suzuki | 307/448 |

OTHER PUBLICATIONS

"Resonant-Tunneling Hot Electron Transistors (RHET): Potential and Applications", Naoki Yokoyama, the 18th (1986 International) Conference on Solid State Devices and Materials, Aug. 20–22, 1986, pp. 347–350.

Primary Examiner—John S. Heyman
Attorney, Agent, or Firm—Armstrong, Nikaido, Marmelstein, Kubovcik & Murray

[57] ABSTRACT

A logic circuit comprises a first terminal for receiving a first power source voltage, a second terminal for receiving a second power source voltage lower than the first power source voltage, a third terminal for receiving a reference voltage, an input terminal for receiving an input voltage, an output terminal for outputting an output voltage, a load coupled between the first terminal and the output terminal, and first and second field effect transistors (FETs) coupled in series between the output terminal and the second terminal. The first FET is coupled to the output terminal and has a gate coupled to the third terminal. The second FET is coupled to the second terminal. The second FET has a gate coupled to the input terminal, and has a junction with a rectifying characteristic between the gate and source thereof.

11 Claims, 7 Drawing Sheets

LOGIC CIRCUIT EMPLOYING FIELD EFFECT TRANSISTOR HAVING JUNCTION WITH RECTIFYING CHARACTERISTIC BETWEEN GATE AND SOURCE

BACKGROUND OF THE INVENTION

The present invention generally relates to logic circuits, and more particularly to a logic circuit capable of carrying out a ternary (3-level) to binary (2-level) logic operation by use of a small number of active elements.

Presently, most logic circuits operate on binary logic with values of "0" and "1", and inverters, NOR circuits and NAND circuits are used as basic gates. Such basic gates are combined to achieve a desired function.

Figure 1:
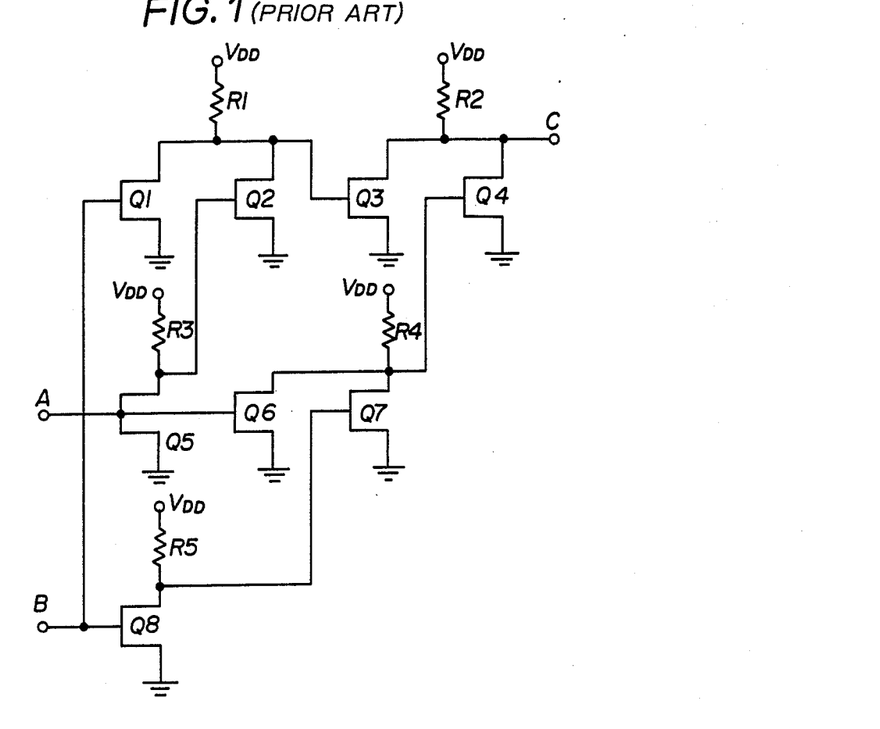
FIG. 1 is a circuit diagram showing an essential part of an example of the conventional exclusive-NOR circuit.

FIG. 1 shows an essential part of an example of the conventional exclusive-NOR circuit. The exclusive-NOR circuit comprises eight field effect transistors (FETs) Q1 through Q8, five resistors R1 through R5, two input terminals A and B, and an output terminal C. In FIG. 1, $V_{DD}$ denotes a positive power source voltage. This exclusive-NOR circuit requires eight active elements, that is, the eight FETs Q1 through Q8. However, in order to realize a logic circuit which can operate at a high speed, it is necessary to increase the operation speed of the basic gate or to make the basic gate have multiple functions so as to reduce the number of the basic gates which are required to realize the logic circuit.

Figure 2:
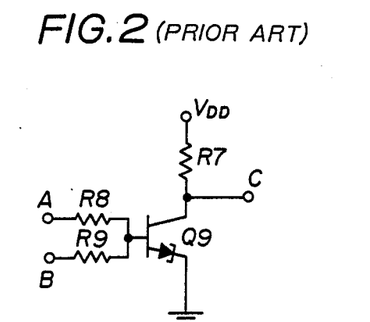
FIG. 2 is a circuit diagram showing an essential part of an example of the conventional exclusive-NOR circuit employing the RHET.

As one candidate for the basic gate which will satisfy the above described demands, a resonant-tunneling hot electron transistor (hereinafter simply referred to as RHET) has been developed recently. FIG. 2 shows an essential part of an example of the conventional exclusive-NOR circuit employing the RHET. In FIG. 2, those parts which are the same as those corresponding parts in FIG. 1 are designated by the same reference numerals, and a description thereof will be omitted. The exclusive-NOR circuit shown in FIG. 2 comprises an RHET Q9, resistors R7 through R9, the input terminals A and B, and the output terminal C.

The RHET Q9 has an approximately N-shaped gate voltage versus drain current characteristic, that is, a differential negative characteristic. Hence, this characteristic is effectively used in FIG. 2, and only one RHET is required as the basic gate to realize the exclusive-NOR circuit. The characteristic of the RHET may be effectively used to realize various other circuits, and the RHET is anticipated as one candidate for the basic gate which would realize a logic circuit capable of operating at a high speed, as discussed in "Resonant-Tunneling Hot Electron Transistors (RHET): Potential and Applications" by Naoki Yokoyama, The 18th (1986 International) Conference on Solid State Devices and Materials, 1986, pp. 347–350.

The exclusive-NOR circuit shown in FIG. 2 is superior compared to that shown in FIG. 1 in that the number of required elements is small and the operation speed is high. However, at the present, it is not easy to produce the RHET because of its vertical structure, and for this reason, it is difficult to produce an integrated circuit of the logic circuit employing the RHET.

Therefore, there is a demand to realize a logic circuit which employs the ordinary easily producible transistors but is capable of obtaining the superior effects obtainable when the RHET is used, such as the small number of required elements and the high operation speed. In other words, there is a demand to realize a logic circuit capable of carrying out a ternary-to-binary logic operation by use of the ordinary easily producible transistors.

SUMMARY OF THE INVENTION

Accordingly, it is a general object of the present invention to provide a novel and useful logic circuit in which the demands described heretofore are satisfied.

Another and more specific object of the present invention is to provide a logic circuit which employs as an active element an FET having a junction with a rectifying characteristic between gate and source. According to the logic circuit of the present invention, the number of active elements required to realize the logic circuit is small, and the operation speed of the logic circuit is high. Furthermore, the logic circuit can easily be produced in the form of an integrated circuit because ordinary easily producible transistors are employed.

Still another object of the present invention is to provide a logic circuit comprising a first terminal for receiving a first power source voltage, a second terminal for receiving a second power source voltage lower than the first power source voltage, a third terminal for receiving a reference voltage, an input terminal for receiving an input voltage, an output terminal for outputting an output voltage, a load coupled between the first terminal and the output terminal, and first and second field effect transistors (FETs) coupled in series between the output terminal and the second terminal. The first FET is coupled to the output terminal and has a gate coupled to the third terminal. The second FET is coupled to the second terminal. The second FET has a gate coupled to the input terminal, and has a junction with a rectifying characteristic between the gate and source thereof.

Other objects and further features of the present invention will be apparent from the following detailed description when read in conjunction with the accompanying drawings.

DETAILED DESCRIPTION

Figure 3:
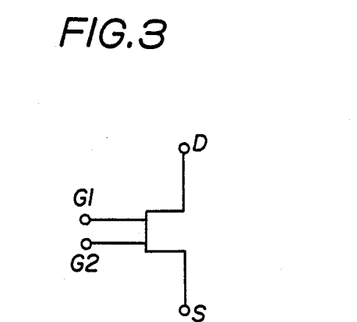
FIG. 3 shows a dual gate FET employed in the present invention.

FIG. 3 shows a dual gate FET which is employed in the present invention. The dual gate FET shown in FIG. 3 is a dual gate high electron mobility transistor (hereinafter simply referred to as a HEMT), and comprises a source S, a drain D, and first and second gates G1 and G2.

Figure 4:
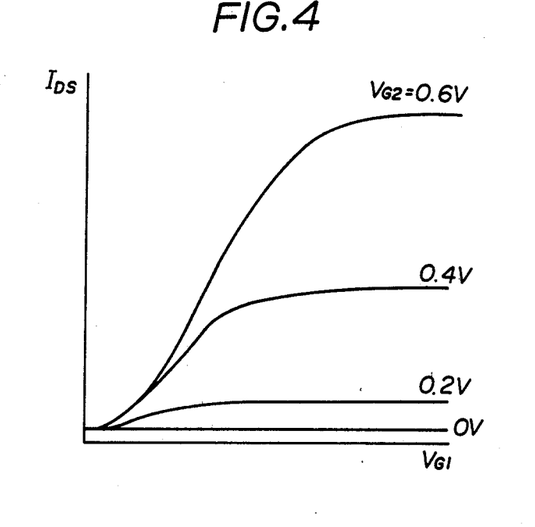
FIGS. 4 and 5 show static characteristics of the dual gate FET shown in FIG. 3 with voltages applied to first and second gates thereof taken as parameters, respectively.

FIG. 4 shows a static characteristic of the dual gate HEMT shown in FIG. 3. In FIG. 4, the abscissa indicates a voltage $V_{G1}$ applied to the first gate G1 and the ordinate indicates a drain-source current $I_{DS}$. A voltage $V_{G2}$ applied to the second gate G2 is taken as the parameter, and the static characteristic is shown for voltages $V_{G2}$ of 0, 0.2 V, 0.4 V, and 0.6 V. A drain-source voltage $V_{DS}$ is set to 1 V.

Figure 5:
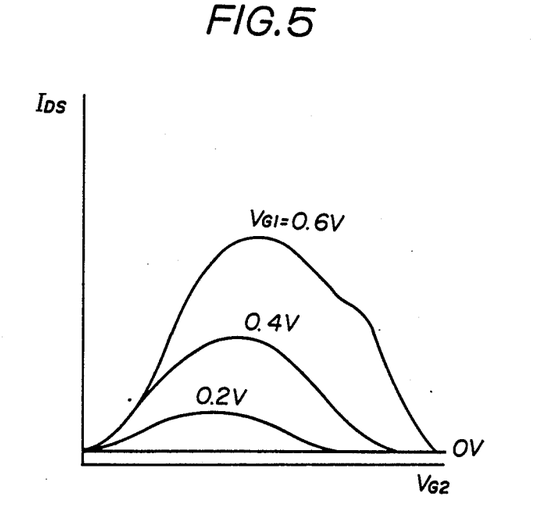

FIG. 5 also shows a static characteristic of the dual gate HEMT shown in FIG. 3. In FIG. 5, the same designations are used as in FIG. 4. In FIG. 5, the abscissa indicates the voltage $V_{G2}$ applied to the second gate G2 and the ordinate indicates the drain-source current $I_{DS}$. The voltage $V_{G1}$ applied to the first gate G1 is taken as the parameter, and the static characteristic is shown for voltages $V_{G1}$ of 0, 0.2 V, 0.4 V, and 0.6 V.

As may be seen from FIGS. 4 and 5, when a forward voltage at the second gate G2 increases, an effective gate voltage at the first gate G1 decreases due to the existence of a forward current and a source resistance of the HEMT. Thus, a negative mutual conductance shown in FIG. 5 is obtained.

As is evident from FIG. 5, the dual gate HEMT shown in FIG. 3 has such a switching characteristic that the dual gate HEMT is turned ON only when the gate voltage is constant. Hence, this switching characteristic may be used to constitute a logic circuit with a small number of elements.

Figure 6:
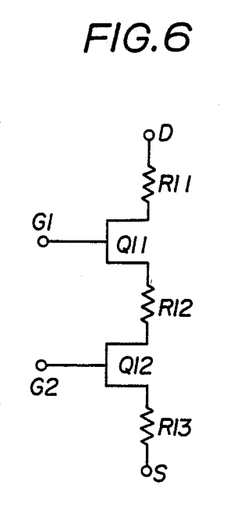
FIG. 6 is a circuit diagram showing a circuit which uses two FETs and is equivalent to the dual gate FET shown in FIG. 3.

The dual gate HEMT shown in FIG. 3 is equivalent to two single gate HEMTs connected in series as shown in FIG. 6. In FIG. 6, those parts which are the same as those corresponding parts in FIG. 3 are designated by the same reference numerals, and a description thereof will be omitted. The dual gate HEMT comprises two HEMTs Q11 and Q12, resistors R11 through R13, the first and second gates G1 and G2, the source S, and the drain D.

Therefore, the dual gate HEMT can be constituted by two ordinary FETs, and the logic circuit according to the present invention may use two ordinary FETs connected in series in place of the dual gate HEMT. But in this case, the FET still needs to have a junction with a rectifying characteristic between the gate and source like a Schottky gate and a pn junction gate.

Figure 7:
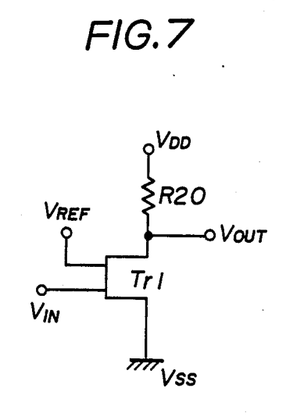
FIG. 7 is a circuit diagram showing a first embodiment of the logic circuit according to the present invention.

FIG. 7 shows a first embodiment of the logic circuit according to the present invention. The logic circuit comprises a dual gate HEMT Tr1 and a resistor R20. In FIG. 7, $V_{IN}$, $V_{OUT}$, $V_{REF}$, $V_{DD}$ and $V_{SS}$ respectively denote an input terminal for receiving an input voltage $V_{IN}$, an output terminal for outputting an output voltage $V_{OUT}$, a reference terminal for receiving a reference voltage $V_{REF}$, a power source terminal for receiving a positive power source voltage $V_{DD}$ and a power source terminal for receiving a power source voltage $V_{SS}$ smaller than the power source voltage $V_{DD}$. In the present embodiment, $V_{SS}$ is the ground voltage.

Figure 8:
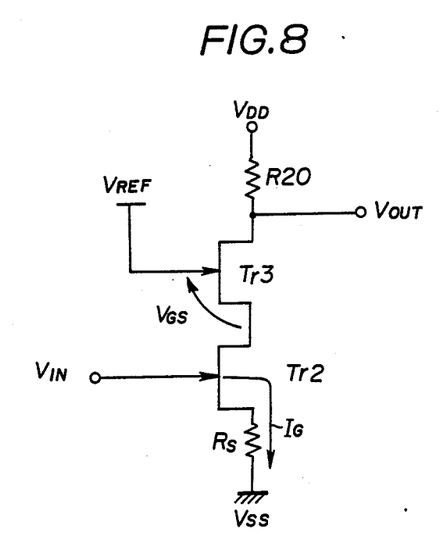
FIG. 8 is a circuit diagram showing a circuit which uses two FETs and is equivalent to the first embodiment shown in FIG. 7.

FIG. 8 shows a circuit which uses two FETs Tr2 and Tr3 and is equivalent to the first embodiment shown in FIG. 7. In FIG. 8, the same designations are used as in FIG. 7, and $R_S$ denotes a source resistance of the FET Tr2. For example, the power source voltage is set to 1.5 V, the reference voltage $V_{REF}$ is set to 0.4 V, and the input voltage $V_{IN}$ is varied from 0 to 1.5 V. When the input voltage $V_{IN}$ is 0, the FET Tr2 is OFF and the output voltage $V_{OUT}$ has a high level. As the input voltage $V_{IN}$ increases and exceeds a threshold voltage (for example, 0.1 V) of the FET Tr2, the FET Tr2 is turned ON. As a result, a source voltage of the FET Tr3 decreases to a voltage close to 0, and a gate-source voltage $V_{GS}$ of the FET Tr3 increases and exceeds a threshold voltage of the FET Tr3 thereby turning ON the FET Tr3. Thus, the output voltage $V_{OUT}$ drops to a low level.

Next, as the input voltage $V_{IN}$ further increases and exceeds a voltage which turns ON a Schottky junction between a gate electrode and a channel region of the FET Tr2, that is, exceeds a built-in potential of the gate Schottky barrier, a gate current $I_G$ flows through the source resistance $R_S$. Generally, the FET parasitically has the source resistance $R_S$, and for this reason, a voltage drop caused by the gate current $I_G$ increases the source potential of the FET Tr3 thereby turning OFF the FET Tr3. Therefore, the output voltage $V_{OUT}$ rises back to the high level.

In order to guarantee the operation of the logic circuit shown in FIGS. 7 and 8, the reference voltage $V_{REF}$ must be set to such a voltage that the following two conditions are satisfied. One condition is that the gate-source voltage $V_{GS}$ of the FET Tr3 is greater than the threshold voltage of the FET Tr3 when the FET Tr2 is ON but the gate current of the FET Tr2 does not flow, and the other condition is that the gate-source voltage $V_{GS}$ of the FET Tr3 is smaller than the threshold voltage of the FET Tr3 when the gate current of the transistor Tr2 flows.

Figure 9:
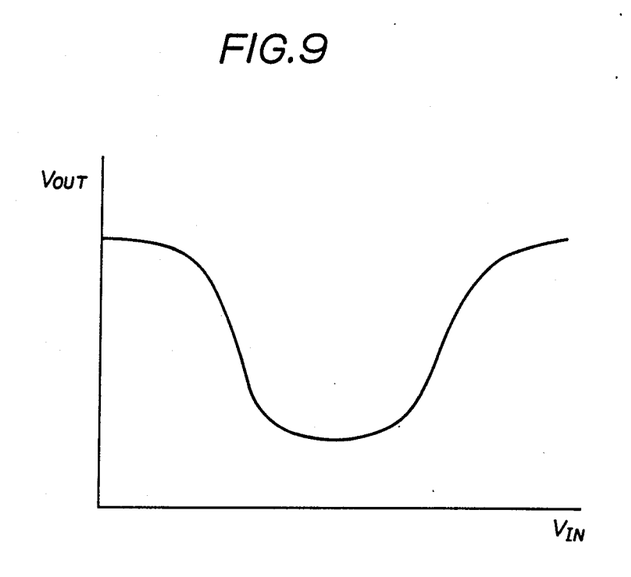
FIG. 9 shows an input voltage versus output voltage characteristic of the first embodiment.

FIG. 9 shows the input voltage $V_{IN}$ versus output voltage $V_{OUT}$ characteristic of the first embodiment of the logic circuit obtained with the reference voltage $V_{REF}$ of 0.4 V. It may be seen from FIG. 9 that as the input voltage $V_{IN}$ changes from the low level to an intermediate level and then to the high level, the output voltage $V_{OUT}$ changes from the high level to the low level and then again to the high level.

As may be seen from FIG. 9, the logic circuits shown in FIGS. 7 and 8 outputs the output voltage $V_{OUT}$ in binary (2-level) responsive to the input voltage $V_{IN}$ in ternary (3-level). Accordingly, it is possible to carry out a ternary to binary logic operation which may be summarized by the following Table 1, where "L" denotes a low level, "H" denotes a high level and "M" denotes an intermediate (or medium) level between the high and low levels. The reference voltage $V_{REF}$ is desirably set to a voltage in a vicinity of a logic threshold voltage at which the input voltage $V_{IN}$ changes from the low level to the intermediate level, and the reference voltage $V_{REF}$ is set to 0.4 V in the present embodiment.

TABLE 1

| Input Voltage $V_{IN}$ | Output Voltage $V_{OUT}$ |
| --- | --- |
| L | H |
| M | L |
| H | H |

Figure 10:
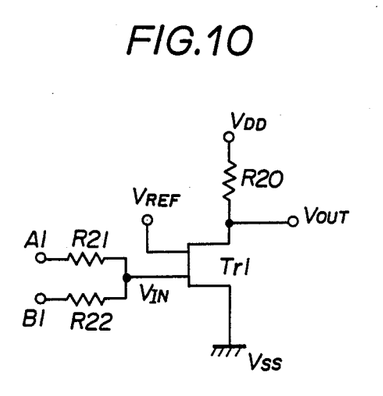
FIG. 10 is a circuit diagram showing a second embodiment of the logic circuit according to the present invention.

FIG. 10 shows a second embodiment of the logic circuit according to the present invention. In FIG. 10, those parts which are the same as those corresponding parts in FIG. 7 are designated by the same reference numerals, and a description thereof will be omitted. The logic circuit shown in FIG. 10 additionally comprises resistors R21 and R22. The following Table 2 summarizes the logic operation of the logic circuit shown in FIG. 10, where A1 and B1 denote input voltages applied to the resistors R21 and R22, respectively.

TABLE 2

| A1 | B1 | $V_{IN}$ | $V_{OUT}$ |
| --- | --- | --- | --- |
| H | H | H | H |
| H | L | M | L |
| L | H | M | L |
| L | L | L | H |

As may be seen from Table 2, the logic circuit shown in FIG. 10 is an exclusive-NOR circuit. The circuit shown in FIG. 10 may also be realized by use of two FETs instead of the dual gate HEMT Tr1, similarly as in the circuit shown in FIG. 8, but description and illustration thereof will be omitted.

Figure 11:
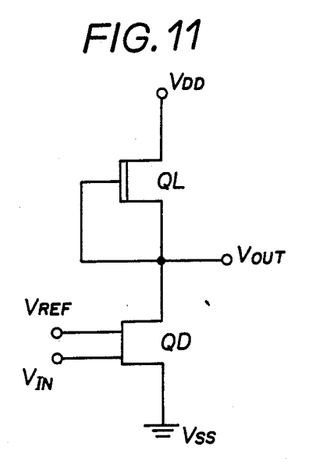
FIG. 11 is a circuit diagram showing a third embodiment of the logic circuit according to the present invention.

FIG. 11 shows a third embodiment of the logic circuit according to the present invention. In FIG. 11, those parts which are the same as those corresponding parts in FIG. 7 are designated by the same reference numerals, and a description thereof will be omitted. In FIG. 11, the logic circuit comprises a depletion type load transistor $Q_L$ which acts as a resistor and a dual gate enhancement type driving transistor $Q_D$.

Figure 12:
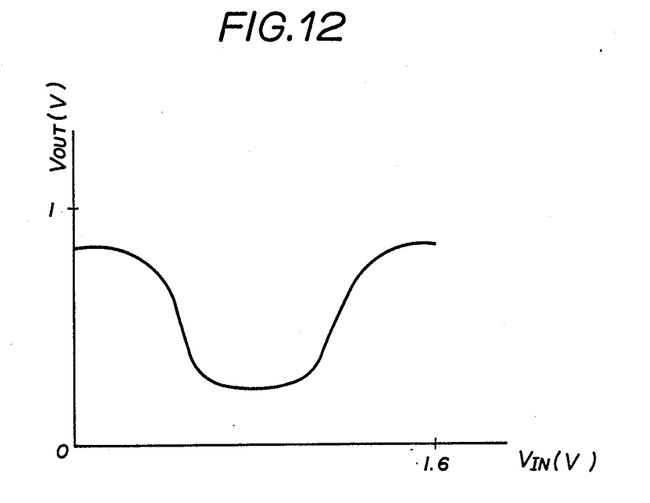
FIG. 12 shows an input voltage versus output voltage characteristic of the third embodiment.

For example, the threshold voltage of the transistor $Q_D$ is 0.1 V, the power source voltage $V_{DD}$ is 1.5 V, and the reference voltage $V_{REF}$ is 0.5 V. When the input voltage $V_{IN}$ is varied from 0 to 1.5 V, the output voltage $V_{OUT}$ varies as shown in FIG. 12. The following Table 3 summarizes the logic operation of the logic circuit shown in FIG. 11.

TABLE 3

| Input Voltage $V_{IN}$ | Output Voltage $V_{OUT}$ |
| --- | --- |
| L (0.2 V) | H (0.8 V) |
| M (0.8 V) | L (0.2 V) |
| H (1.3 V) | H (0.8 V) |

Figure 13:
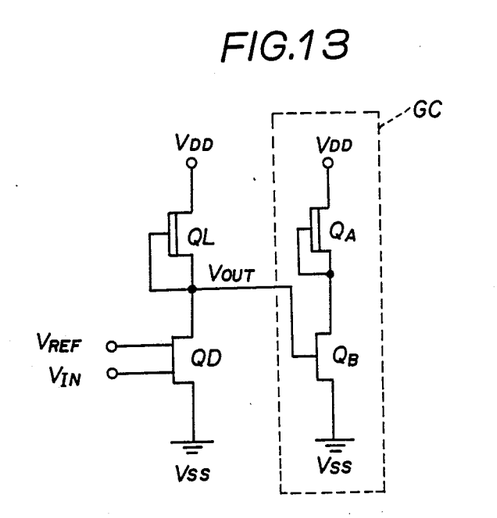
FIG. 13 is a circuit diagram showing a modification of the third embodiment.

As may be seen from Table 3, the logic operation of the logic circuit shown in FIG. 11 is identical to that of the logic circuits shown in FIGS. 7 and 8. It is possible to connect a gate circuit GC as shown in FIG. 13 so as to clamp the high level of the output voltage $V_{OUT}$ to approximately 0.8 V. In FIG. 13, $Q_A$ denotes a depletion type transistor and $Q_B$ denotes an enhancement type transistor.

Figure 14:
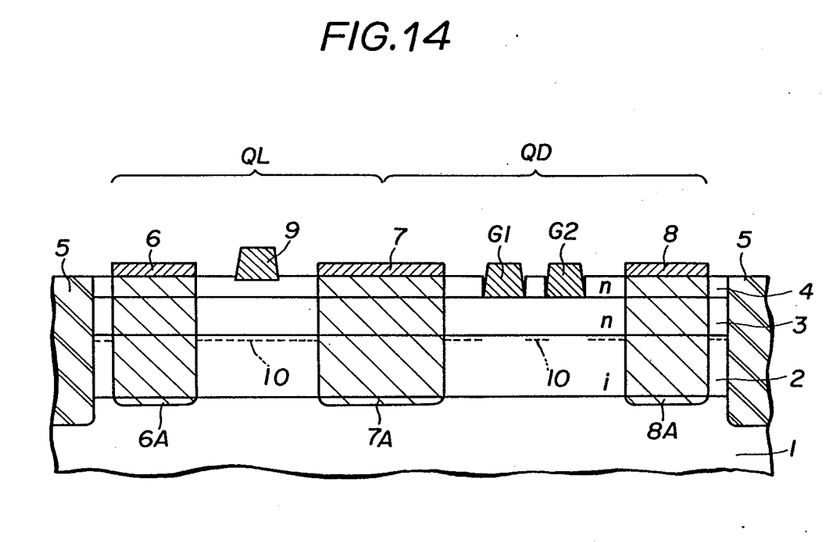
FIG. 14 is a cross sectional view showing an essential part of a semiconductor device using a dual gate high electron mobility transistor for the third embodiment of the logic circuit.

FIG. 14 shows in cross section an essential part of a semiconductor device which uses a dual gate HEMT for the logic circuit shown in FIG. 7. In FIG. 14, those parts which are the same as those corresponding parts in FIG. 7 are designated by the same reference numerals. In FIG. 14, the logic circuit comprises a semiinsulative GaAs substrate 1, an intrinsic GaAs channel layer 2, an n-type AlGaAs electron supplying layer 3, an n-type GaAs contact layer 4, isolation regions 5, a drain electrode 6, a metallized region 7A, a source/drain electrode 7, a metallized region 7A, a source electrode 8, a metallized region 8A, a gate electrode 9, a two dimensional electron gas layer 10, and dual gate electrodes G1 and G2 of the transistor $Q_D$. The load transistor $Q_L$ is a depletion type HEMT.

The circuit shown in FIG. 14 can be produced by use of the general technique used for producing the HEMT except for the formation of the dual gates G1 and G2. The formation of the dual gates introduces no difficulties technically, and only a mask pattern changes.

Figure 15:
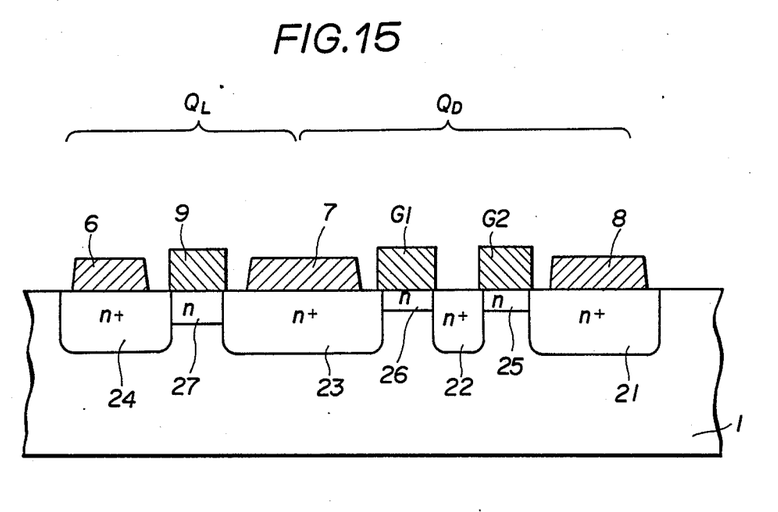
FIG. 15 is a cross sectional view showing an essential part of a semiconductor device using a dual gate metal semiconductor FET for the third embodiment of the logic circuit.

FIG. 15 shows in cross section an essential part of a semiconductor device which uses a dual gate metal semiconductor FET (hereinafter simply referred to as a MESFET) for the logic circuit shown in FIG. 7. In FIG. 15, those parts which are the same as those corresponding parts in FIG. 7 are designated by the same reference numerals. In FIG. 15, the logic circuit comprises an n+-type source region 21, an n+-type doped region 22, a source/drain region 23, a drain region 24, and n-type channel regions 25, 26 and 27. The load transistor $Q_L$ is a depletion type MESFET.

Figure 16:
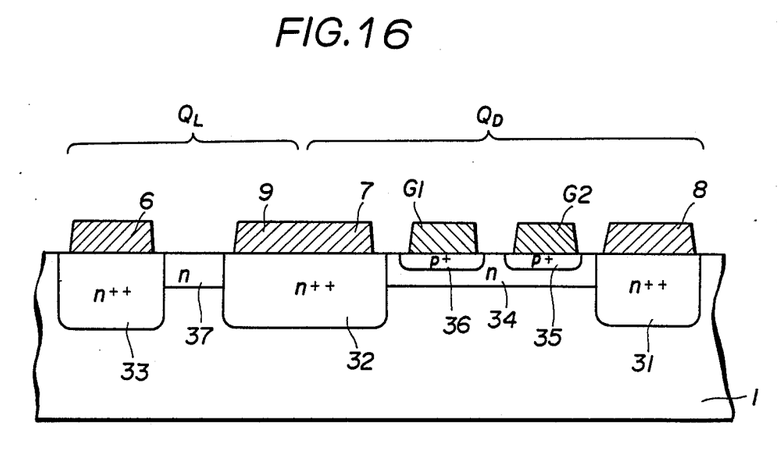
FIG. 16 is a cross sectional view showing an essential part of a semiconductor device using a dual gate junction FET for the third embodiment of the logic circuit.

FIG. 16 shows in cross section an essential part of a semiconductor device which uses a dual gate junction FET (hereinafter simply referred to as JFET) for the logic circuit shown in FIG. 7. In FIG. 16, those parts which are the same as those corresponding parts in FIG. 7 are designated by the same reference numerals. In FIG. 16, the logic circuit comprises an n++-type source region 31, an n++-type source/drain region 32, an n++-type drain region 33, an n-type channel region 34, p+-type gate regions 35 and 36, and an n-type channel region 37. The load transistor $Q_L$ is a depletion type JFET or a saturation type resistor. In case of the JFET, when the gate voltage exceeds a diffusion potential of the gate pn junction, the gate current flows.

Therefore, according to the present invention, the logic circuit uses as the active element an FET having a junction with a rectifying characteristic between the gate and source like the Schottky gate or the pn junction. A dual gate FET or two single gate FETs connected in series constitute a four terminal logic circuit having a negative mutual conductance. The basic gate which can carry out the ternary to binary logic operation is constituted by a small number of active elements, and for example, an exclusive-OR circuit may be constituted by the same small number of active elements. Because of the small number of active elements used, the operation speed of the logic circuit is high. In addition, since ordinary easily producible FETs can be used as the active elements, it is possible to produce the logic circuit in the form of an integrated circuit with ease.

Further, the present invention is not limited to these embodiments, but various variations and modifications may be made without departing from the scope of the present invention.

What is claimed is:
1. A logic circuit comprising:

a first terminal for receiving a first power source voltage;

a second terminal for receiving a second power source voltage lower than the first power source voltage;

a third terminal for receiving a reference voltage;

an input terminal for receiving an input voltage;

an output terminal for outputting an output voltage;

a load coupled between said first terminal and said output terminal; and first and second field effect transistors coupled in series between said output terminal and said second terminal, said first field effect transistor being coupled to said output terminal and having a gate coupled to said third terminal, said second field effect transistor being coupled to said second terminal and having a gate coupled to said input terminal, said second field effect transistor having a junction with a rectifying characteristic between the gate and source thereof, and wherein said reference voltage applied to said third terminal is set to such a voltage that a gate-source voltage of said first field effect transistor is greater than a threshold voltage of said first field effect transistor when said second field effect transistor is ON but the gate current of said second field effect transistor does not flow, and the gate-source voltage of said first field effect transistor is smaller than the threshold voltage of said first field effect transistor when the gate current of said second field effect transistor flows.

2. A logic circuit as claimed in claim 1 in which the input voltage applied to said input terminal varies within such a range that a gate-source voltage of said second field effect transistor varies from a voltage lower than a threshold voltage of said second field effect transistor to a voltage higher than a voltage at which the gate current of said second field effect transistor flows.

3. A logic circuit as claimed in claim 1 in which said first and second field effect transistors are high electron mobility transistors.

4. A logic circuit as claimed in claim 1 in which said first and second field effect transistors are metal semiconductor field effect transistors.

5. A logic circuit as claimed in claim 1 in which said first and second field effect transistors are junction field effect transistors.

6. A logic circuit as claimed in claim 1 in which said load is a resistor.

7. A logic circuit as claimed in claim 1 in which said load is a depletion type field effect transistor.

8. A logic circuit as claimed in claim 1 in which said load is a saturation type resistor.

9. A logic circuit as claimed in claim 1 in which said first and second field effect transistors constitute a dual gate high electron mobility transistor.

10. A logic circuit comprising:
a first terminal for receiving a first power source voltage;

a second terminal for receiving a second power source voltage lower than the first power source voltage;

a third terminal for receiving a reference voltage;

an input terminal for receiving an input voltage;

an output terminal for outputting an output voltage;

a load coupled between said first terminal and said output terminal; and first and second field effect transistors coupled in series between said output terminal and said second terminal, said first field effect transistor being coupled to said output terminal and having a gate coupled to said third terminal, said second field effect transistor being coupled to said second terminal and having a gate coupled to said input terminal, said second field effect transistor having a junctin with a rectifying characteristic between the gate and source thereof, said output terminal outputting an output voltage having a fourth level responsive to an input voltage applied to said input terminal with a second level, outputting an output voltage having a fifth level responsive to an input voltage applied to said input terminal with a third level, and outputting an output voltage having the fourth level responsive to an input voltage applied to said input terminal with the first level, said first level being higher than said second level, said third level being an intermediate level between said first and second levels, said fourth level being higher than said fifth level.

11. A logic circuit comprising:
a first terminal for receiving a first power source voltage;

a second terminal for receiving a second power source voltage lower than the first power source voltage;

a third terminal for receiving a reference voltage;

an input terminal for receiving an input voltage;

an output terminal for outputting an output voltage;

a load coupled between said first terminal and said output terminal; and first and second field effect transistors coupled in series between said output terminal and said second terminal, said first field effect transistor being coupled to said output terminal and having a gate coupled to said third terminal, said second field effect transistor being coupled to said second terminal and having a gate coupled to said input terminal, said second field effect transistor having a junction with a rectifying characteristic between the gate and source thereof, said output terminal outputting an output voltage having a fourth level responsive to an input voltage applied to said input terminal with a second level, outputting an output voltage having a fifth level responsive to an input voltage applied to said input terminal with a third level, and outputting an output voltage having the fourth level responsive to an input voltage applied to said input terminal with the first level, said first level being higher than said second level, said third level being an intermediate level between said first and second levels, said fourth level being higher than said fifth level, said reference voltage applied to said third terminal being set to a voltage in a vicinity of a logic threshold voltage at which said input voltage changes from the second level to the third level.

* * * * *